(12) United States Patent
Messina et al.

(10) Patent No.: US 7,099,906 B2
(45) Date of Patent: Aug. 29, 2006

(54) RANDOM BIT SEQUENCE GENERATOR

(75) Inventors: Marco Messina, Augusta (IT);
Antonino La Malfa, Milazzo (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 614 days.

(21) Appl. No.: 10/270,020

(22) Filed: Oct. 11, 2002

(65) Prior Publication Data
US 2003/0093455 A1 May 15, 2003

(30) Foreign Application Priority Data
Oct. 12, 2001 (IT) .......................... VA2001A0033

(51) Int. Cl.
G06F 1/02 (2006.01)
G06J 1/00 (2006.01)
(52) U.S. Cl. ......................................... 708/255; 708/3
(58) Field of Classification Search ................ 708/255, 708/3
See application file for complete search history.

(56) References Cited

U.S. PATENT DOCUMENTS

| | | | | |
|---|---|---|---|---|
| 4,176,399 A | * | 11/1979 | Hoffmann et al. | 708/250 |
| 4,355,366 A | * | 10/1982 | Porter | 708/255 |
| 4,545,024 A | * | 10/1985 | Maher et al. | 708/255 |
| 5,239,494 A | * | 8/1993 | Golbeck | 708/3 |
| 5,706,218 A | * | 1/1998 | Hoffman | 708/251 |
| 5,926,066 A | * | 7/1999 | Sauer | 330/9 |
| 5,961,577 A | * | 10/1999 | Soenen et al. | 708/251 |
| 6,061,702 A | * | 5/2000 | Hoffman | 708/251 |
| 6,070,178 A | * | 5/2000 | Anderson et al. | 708/3 |
| 6,195,669 B1 | * | 2/2001 | Onodera et al. | 708/3 |
| 6,571,263 B1 | * | 5/2003 | Nagai | 708/3 |
| 6,795,837 B1 | * | 9/2004 | Wells | 708/3 |

* cited by examiner

*Primary Examiner*—Tan V. Mai
(74) *Attorney, Agent, or Firm*—Lisa K. Jorgenson; Bryan A. Santarelli; Graybeal Jackson Haley LLP

(57) ABSTRACT

A random-bit sequence generator includes a biasing circuit, a source of a noisy voltage signal biased by the biasing circuit, an amplification stage generating an amplified signal representative of the sole non-zero-frequency (AC) component of the noisy voltage signal and an output stage electrically in cascade to the amplification stage that generates a random bit sequence in function of the amplified signal. The generator also filters the undesired low-frequency disturbance components because the amplification stage comprises an input low-pass filter that feeds the zero- (DC) component of the noisy voltage signal to one of the inputs of a differential amplifier, to another input of which is fed the non-filtered noisy voltage signal.

26 Claims, 6 Drawing Sheets

RANDOM BIT SEQUENCE GENERATOR

CROSS-REFERENCE TO RELATED APPLICATIONS

This application claims priority from Italian patent application VA2001A000033, filed Oct. 12, 2001; and is herein incorporated by reference.

FIELD OF THE INVENTION

The present invention relates to random number generators and in particular to a random bit sequence generator.

BACKGROUND OF THE INVENTION

Random number generators (RNG) are used in many technical fields, such as for example, cryptography, for generating cryptographic keys and for setting in a random manner certain variables in cryptographic protocols, videogames, and for realizing games strictly based on chance.

RNGs may be generated via software or via hardware. Software-based RNGs implement an algorithm that, iterated from a certain start value called the "seed" of the algorithm, generates a sequence of numbers uniformly distributed in a certain interval. Clearly, any sequence of number produced by them is periodical and may be predicted by knowing the algorithm and the seed of the algorithm. These software generators are also called Pseudo-RNGs because the sequences of numbers produced by these generators are predictable, and thus they are not true random sequences. Notwithstanding that their realization is easy, Pseudo-RNGs are unsuitable in applications, such as cryptography, in which it is absolutely necessary to generate unpredictable cryptographic keys.

Hardware-based RNGs are devices that generate random number sequences by exploiting physical phenomena. These generators may be deterministic systems with a very complex dynamic or systems, also called True-RNGs, that exploit chaotic or noisy physical phenomena, such as for instance the thermal noise of a resistor or a diode. One characteristic of this kind of RNG is that the generated sequence of numbers is practically unpredictable, which makes them particularly suited to be used in cryptography.

There are many examples of RNGs based on chaotic physical phenomena, three of which are disclosed herein.

U.S. Pat. No. 6,061,702 describes a True-RNG that uses a voltage controlled oscillator (VCO) driven by the signal obtained by amplifying the thermal noise of a pair of resistors. The VCO generates a signal that has a frequency that varies in a random manner and that is used to sample the signal produced by a plurality of stable oscillators whose frequency is greater than that of the signal produced by the VCO.

U.S. Pat. No. 5,961,577 describes a True-RNG comprising an oscillator, composed of a plurality of ring amplifiers having noise sensitive circuits, and a comparator that generates a random logic signal by comparing the output of one of the amplifiers with a pre-established threshold.

The architecture of the above mentioned circuits is relatively complex because they require a VCO or a plurality of ring amplifiers.

U.S. Pat. No. 6,195,669 describes a True-RNG in which a noisy signal, produced by a noise generator, is input to a high gain amplifier that, having blocking capacitors for the DC component (offset of the signal), amplifies only the AC component of the signal. This amplified AC component is converted to a random bit sequence by an analog-to-digital converter. This circuit needs blocking capacitors for preventing the DC component of the noisy signal (offset of the signal) from saturating the high gain amplifier. Therefore, an implied drawback of this circuit is that it operates with a signal that sometimes has an inverted polarity, and thus the circuit that processes this signal must be supplied with a positive and a negative supply voltage.

SUMMARY OF THE INVENTION

It has been found that an RNG based on noisy physical phenomena (True-RNG) is simpler to realize than prior art generators.

According to an embodiment of the invention, the circuit solves the problems due to the offset of the signal without requiring blocking capacitors. Because the circuit amplifies the AC component of the signal produced by a source of thermal noise via a differential amplifier, the noise signal and the DC component thereof can be extracted by a low-pass filter.

More precisely, one embodiment of the present invention is a random bit sequence generator comprising a biasing circuit, a source of a noisy voltage signal biased by the biasing circuit, an amplification stage for generating an amplified signal representative of the AC component of the noisy voltage signal and an output stage electrically in cascade to the amplification stage that generates a random bit sequence as a function of the amplified signal.

One characterizing feature of this embodiment of the invention is that the amplification stage comprises an input low-pass filter that feeds the DC component of the noisy voltage signal to one of the inputs of a differential amplifier, to another input of which is fed the non-filtered noisy voltage signal.

In this way, not only it is possible to exploit only the noisy AC component by simply adapting the working point of the differential amplifier, but it is also possible to filter, already in the pre-amplification phase, the undesired low-frequency disturbance components due, for example, to variations of the supply voltage, to thermal drift of electrical parameters, or capacitive couplings with other signals of the device. By designing the parameters of the low pass filter, it is possible to determine the time window over which to average the noisy voltage signal for extracting its DC component.

It should be remarked that this embodiment of the invention preserves the ability to elaborate signals with a non-null average, i.e. generally signals that do not invert their sign. By using signals that do not invert their sign, it is possible to employ a single voltage power supply.

The output stage of this embodiment generates a square wave signal that switches between the high and low states at every inversion of the AC component of the amplified signal. The output stage comprises a sampling circuit for producing the random bit sequence by sampling the square wave signal with a clock signal that may be provided by external circuitry.

BRIEF DESCRIPTION OF THE DRAWINGS

The different aspects and advantages of various embodiments of the present invention will appear even more evident through a detailed description of an embodiment referring to the attached drawings, in which.

DESCRIPTION OF AN EMBODIMENT OF THE INVENTION

Figure 1:
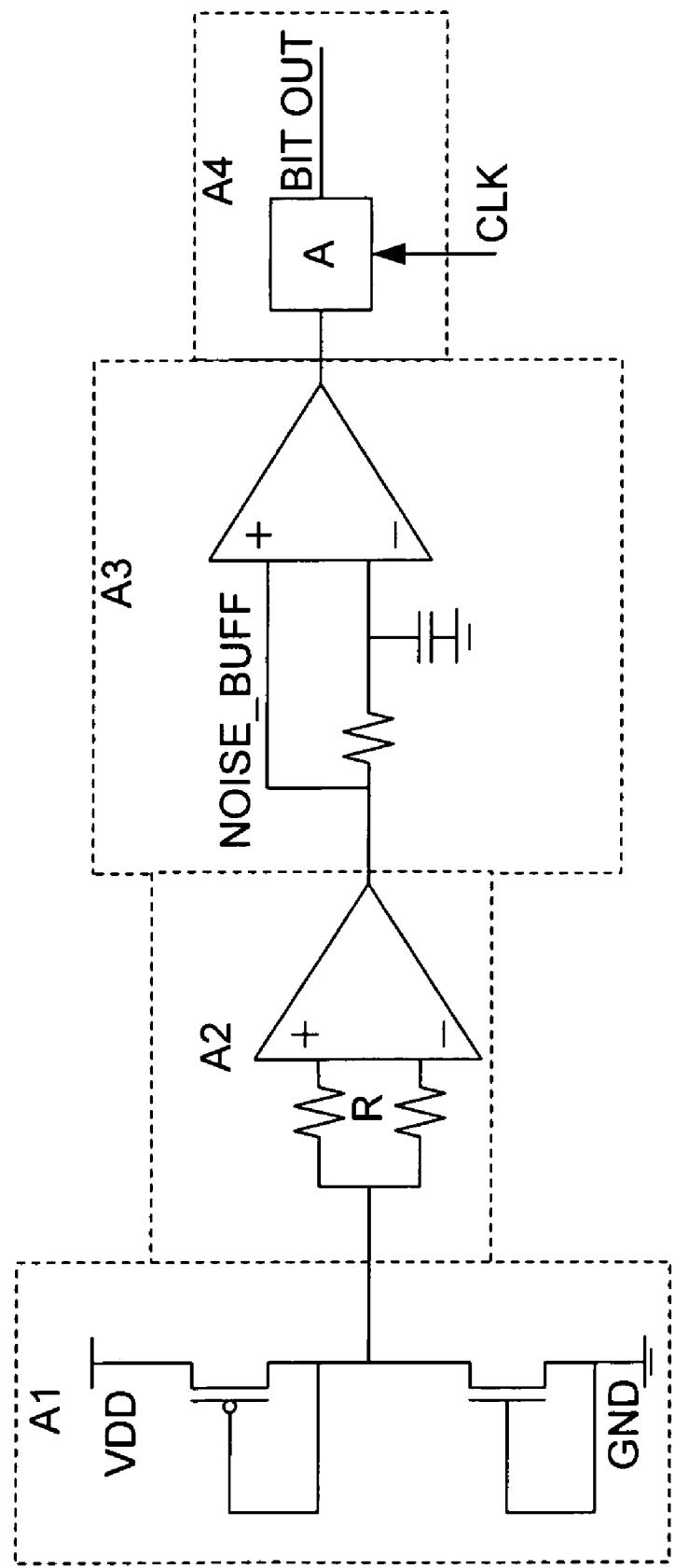
FIG. 1 is an embodiment of the invention in which the amplification stage A3 is realized using a low-pass filter.

An RNG according to an embodiment of the invention is depicted in FIG. 1. It comprises a biasing circuit A1 that provides a certain bias voltage to a source A2 of a noisy voltage signal NOISE_BUFF, by an amplification stage A3 of the AC component of the signal NOISE_BUFF and an output stage A4 that generates the random bit sequence.

The biasing line A1 may be realized in various modes. For example, biasing may be accomplished by connecting, in series, two or more diode-connected MOSFET transistors between the supply nodes, as depicted in FIG. 1, or by using a common resistive voltage divider. In the sample embodiment of FIG. 1, two diode-connected MOSFETs of opposite conductivity are used, such that the P-channel MOSFET is always in a conduction or turned on state while the N-channel MOSFET is always in a turned off state, because in this way the noise source A2 may be satisfactorily biased while limiting power consumption.

For sake of simplicity, the noise source A2 may be realized as shown by using a differential amplifier that amplifies the thermal noise voltage of a pair of resistors, but any other contrivance capable of producing a noisy voltage signal can be used.

The stage A3 produces an amplified replica signal of the AC component of the noise signal NOISE_BUFF without using blocking capacitors.

Basically, a low-pass filter extracts the DC component of the noise signal NOISE_BUFF that is applied to an input of a differential amplifier, while the non filtered noise signal NOISE_BUFF is applied to the other input of the difference amplifier. A simple class A amplifier may be used in view of the fact that the noise signal has a non null average.

In the embodiment of FIG. 1, the low-pass filter is a first order R-C filter, but nothing hinders using any other type of low-pass filter may be used.

The amplified signal representative of the AC component of the signal NOISE_BUFF is fed to the output stage A4, which produces a square wave signal that switches between high and low states every time the AC component of the signal NOISE_BUFF inverts. Finally the square wave signal is sampled with a clock CLK, which in the embodiment of FIG. 1, is externally provided for outputting a random bit number sequence BIT OUT.

According to one embodiment, the square wave signal is generated by a power amplifier, input with the amplified differential signals produced on the inverting output and on the non inverting output of the differential amplifier of the preceding stage. In this way it is possible to detect inversions of the AC component of the amplified AC component of a noisy voltage signal having a non null average.

A detailed diagram of an embodiment of the RNG of FIG. 1 is depicted in FIGS. 2–5. In FIGS. 2–5, four sub-circuits B1, B2, B3, B4 may be observed in detail and as illustrated near each component, are indicated representative values of the relevant electrical parameters.

Figure 2:
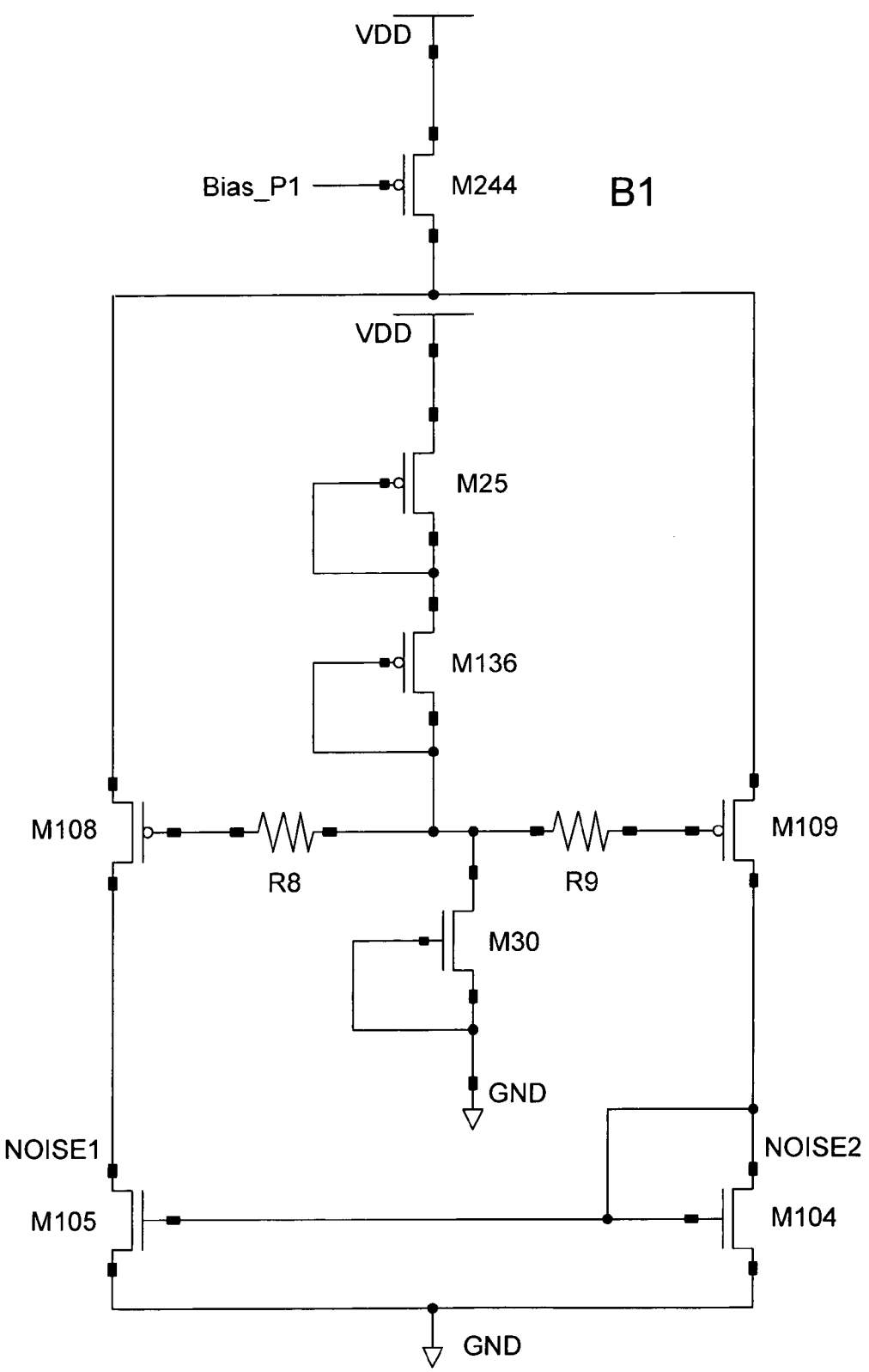
FIGS. 2–5 are detailed schematic diagrams of an embodiment of the circuit of FIG. 1.

Referring to FIG. 2, the biasing circuit, depicted in FIG. 2., comprises two P-channel MOSFETs M25 and M136 always in a conduction (on) state and by the N-channel MOSFET M30 always in a non-conducting (off) state, and provides a desired bias voltage to the noise source comprising two resistors R8 and R9 and a differential amplifier comprising transistors M108, M109, M104 and M105. The transistor M244, driven by the signal B$_{IAS}$_P1, controls the operation of the differential amplifier.

Figure 3:
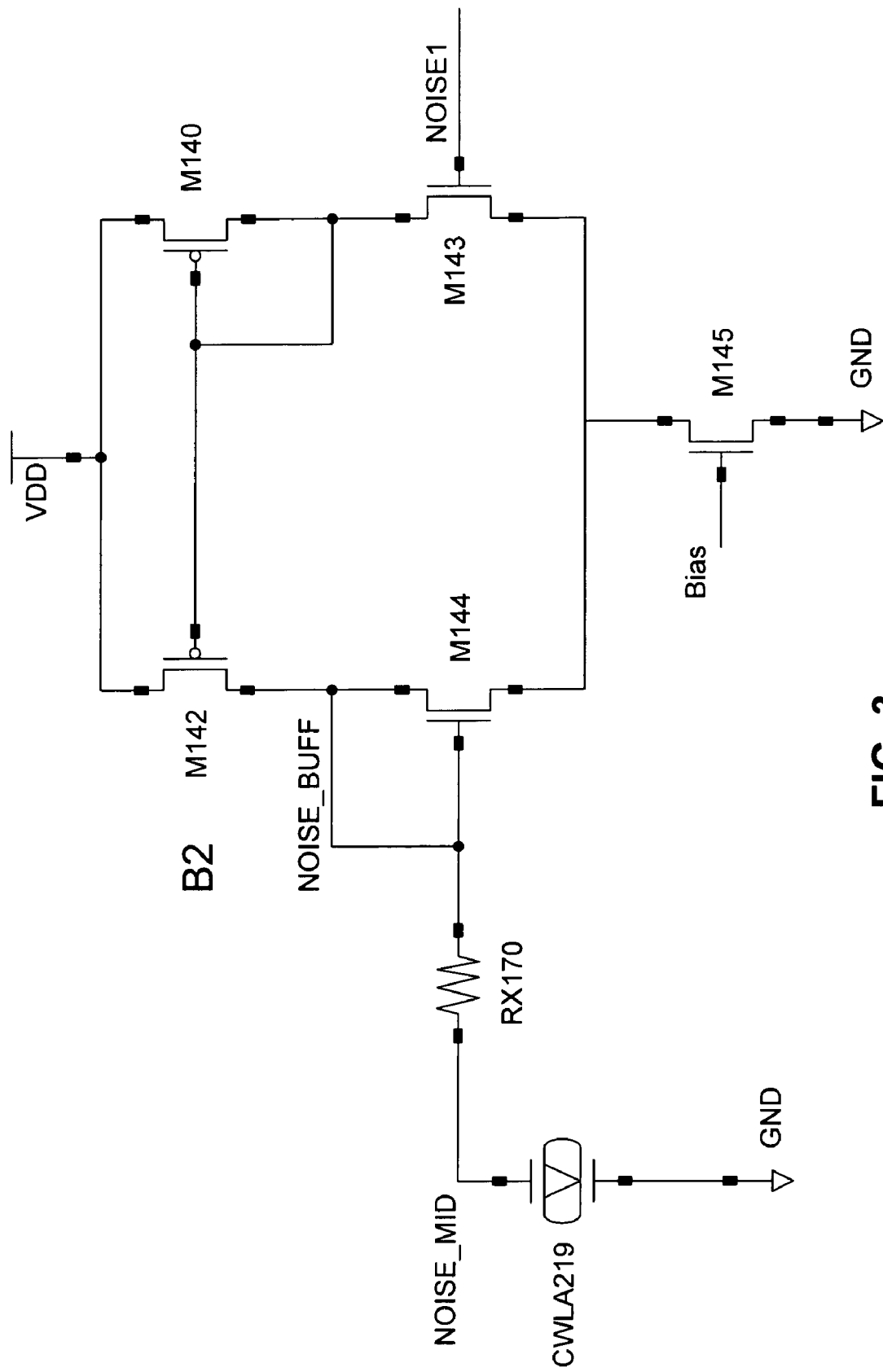

Referring to FIG. 3, the output signal NOISE1 is fed to a voltage buffer, depicted in the sub-circuit B2, comprising MOSFETs M140, M142, M143, M144, for generating the noisy voltage signal NOISE_BUFF.

Even in this embodiment, the low-pass filter is a simple R-C filter, comprising a resistor RX170 and a capacitor CWLA219. It filters out the DC component NOISE_MID of the signal NOISE_BUFF.

Figure 4:
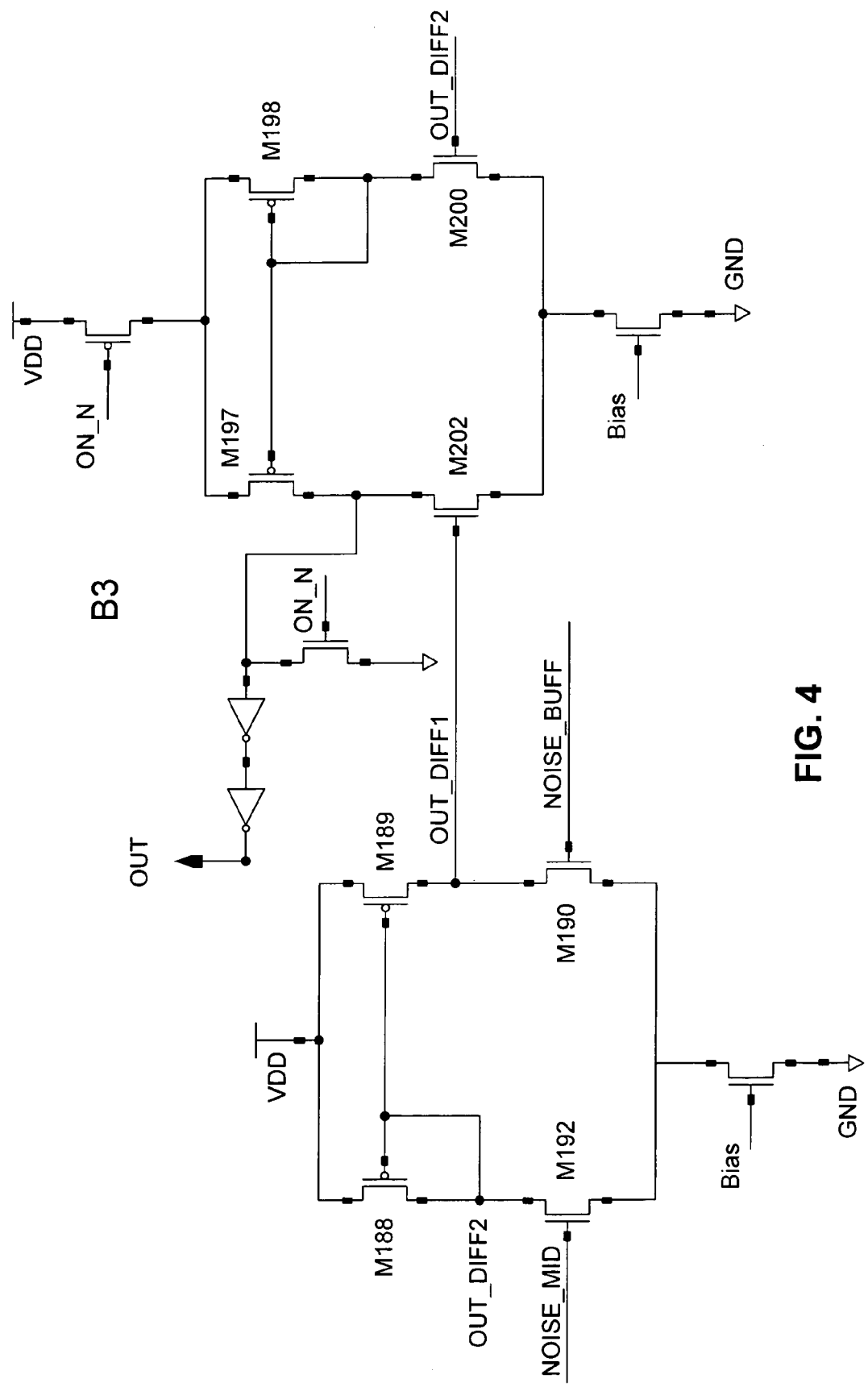

Referring to FIG. 4, as depicted in the sub-circuit B3, both signals, NOISE_MID and NOISE_BUFF are applied to respective inputs of the fully differential amplifier, which comprises MOSFETs M190, M192, M189 and M188, whose differential outputs: OUT_DIFF1 and OUT_DIFF2, are input, respectively, to a power amplifier comprising MOSFETs M202, M200, M197 and M198 and to two cascaded inverters. In this way the difference between the signals OUT_DIFF1 and OUT_DIFF2 is amplified according to a saturated characteristic for producing the square wave signal OUT.

Figure 5:
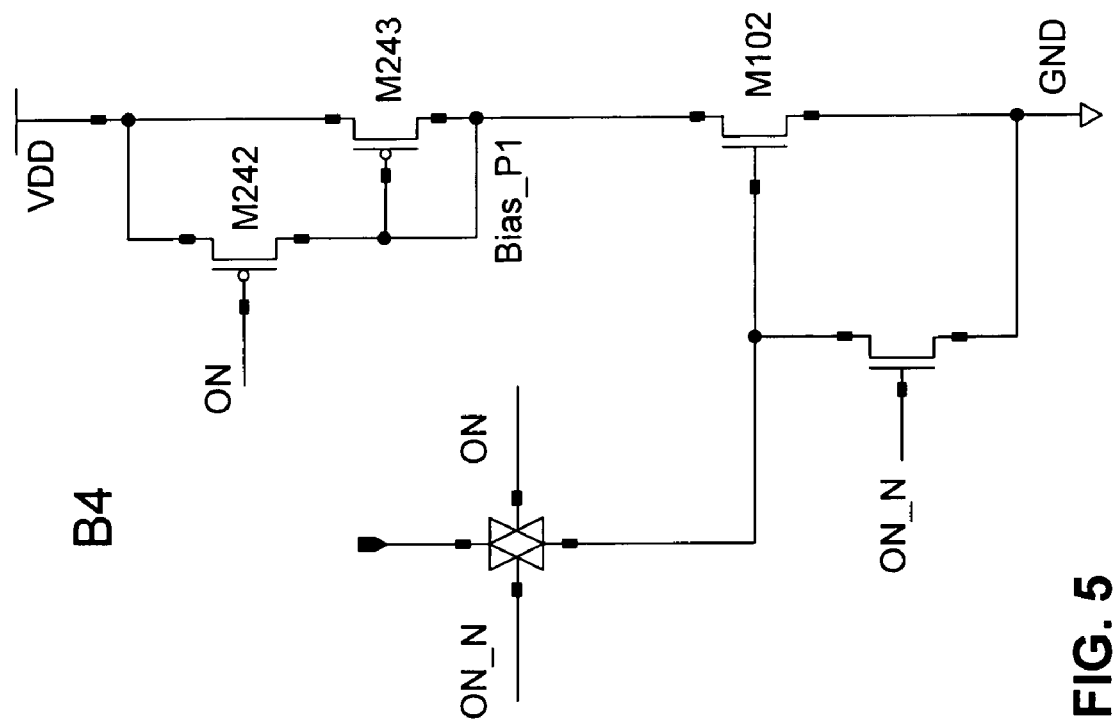

Referring to FIG. 5, the sub-circuit B4 has the function of turning on the noise source.

When a turn-on signal ON is active, the transistor M102 is set in a conduction state while the transistor M242 switches in a non-conducting state, the voltage B$_{IAS}$_P1 on the control node of the MOSFET M243 becomes null, and the MOSFET M244 of the sub-circuit B1 switches on powering the differential amplifiers M108, M109, M104, M105 (FIG. 2).

Figure 6:
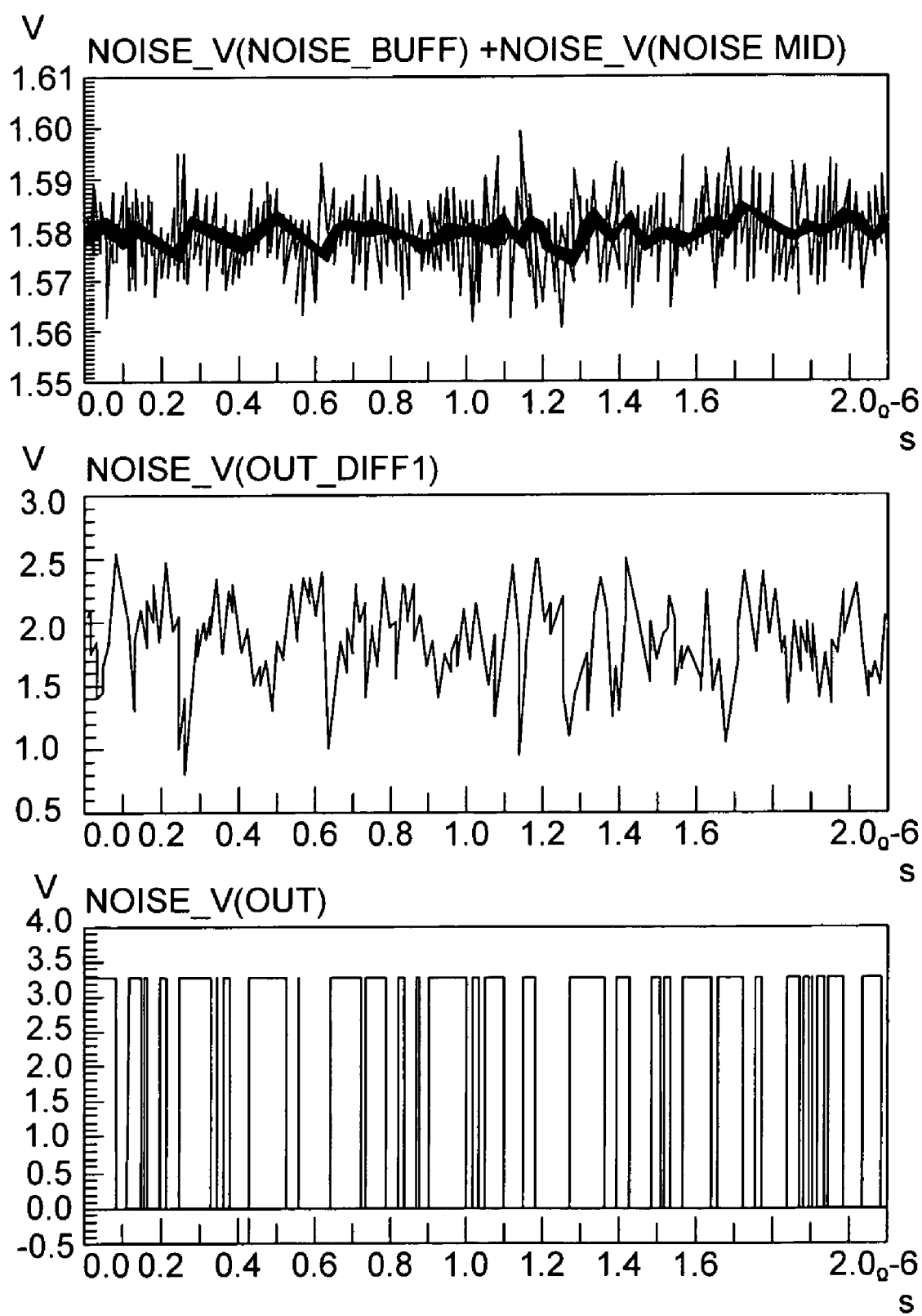
FIG. 6 shows representative waveforms of the main signals of the circuit of FIGS. 2–5.

Waveforms of the main signals of the circuit of FIGS. 2–5 are depicted in FIG. 6. They relate to a sample circuit implementation with the parameters indicated near each component of FIGS. 2–5.

Accordingly, this invention is not to be considered limited to the specific examples chosen for purposes of disclosure, but rather to cover all changes and modifications that are within the spirit and scope of the present invention. The invention is therefore not limited by the description contained herein or by the drawings.

We claim:

1. A generator of a random bit sequence comprising:

a biasing circuit;

a source of a noisy voltage signal, biased by said bias circuit;

an amplification stage generating an amplified signal representative of the sole AC component of said noisy signal; and an output stage electrically in cascade to said amplification stage generating said random bit sequence in function of said amplified AC component;

characterized in that said amplification stage comprises:

an input low-pass filter extracting the DC component of said noisy signal;

a differential amplifier producing said amplified AC component signal, receiving on an non inverting input said noisy voltage signal and on an inverting input said DC component extracted by the input low-pass filter;

said output stage comprises:

a generator of a square wave signal switching between a high and a low state at every inversion of said amplified AC component signal; and a sampling circuit sampling said square wave signal with a clock signal and generating said random bit sequence.

2. The generator of claim 1, wherein said generator of a square wave signal comprises a power differential amplifier with saturated amplification characteristic, input with amplified differential signals of said AC component present on an inverting and on a non inverting output of said differential amplifier.

3. The generator according to claim 1, wherein said low-pass filter comprises an R-C filter of the first order.

4. The generator according to claim 1, wherein said source of a noisy signal comprises a differential amplifier amplifying a thermal voltage signal developed in a pair of input resistors, connected in common to the bias node of said bias circuit each having the other terminal connected to a respective input of the differential amplifier.

5. The circuit according to claim 1, wherein said bias circuit comprises two diode-connected P-channel MOSFETs connected in series between a supply node and the bias node of said source, and by a diode-connected N-channel MOSFET connected between the bias node and ground.

6. A random sequence generator for generating a sequence of random bits, the generator comprising:
an amplification circuit operable to filter out a DC component of a noise signal and to amplify an AC component of the noise signal, the amplification circuit comprising,
a differential amplifier operable to receive the noise signal on a first input, and
a filter coupled to a second input of the differential amplifier, the filter operable to pass the DC component of the noise signal to the second input; and
a wave conversion circuit operable to convert the amplified AC component of the noise signal into a random sequence of bits.

7. The random sequence generator of claim 6, wherein the filter comprises an R-C filter of the first order.

8. The random sequence generator of claim 6 wherein the wave conversion circuit comprises a generator of a square wave signal, the generator switching between a high and a low state at every inversion of said amplified AC component signal.

9. The random sequence generator of claim 8 wherein the wave conversion circuit further comprises a sampling circuit operable to sample the square wave.

10. The random sequence generator of claim 9 wherein the sampling circuit samples the square wave at a predetermined clock rate.

11. The random sequence generator of claim 6 further comprising a generator operable to generate the noise signal.

12. The random sequence generator of claim 11 wherein the wave-conversion circuit comprises a power differential amplifier having inputs operable to receive the amplified AC component of the noise signal from the amplification circuit.

13. The random sequence generator of claim 11 further comprising a biasing circuit having a bias node coupled to the generator.

14. A random sequence generator for generating a sequence of random bits, the generator comprising:
an amplification circuit operable to filter out a DC component of a noise signal and to amplify an AC component of the noise signal;
a wave conversion circuit operable to convert the amplified AC component of the noise signal to a random sequence of bits;
a generator operable to generate the noise signal; and
a biasing circuit having,
a bias node coupled to the generator,
a first diode-connected P-channel MOSFET coupled to a voltage supply node and the bias node,
a second diode-connected P-channel MOSFET coupled to the voltage supply node and the bias node, and
a diode-connected N-channel MOSFET coupled to the bias node and ground.

15. A method for generating a random bit sequence, the method comprising:
filtering out a DC component of a noise signal;
amplifying an AC component of the filtered noise signal;
converting the amplified AC component of the noise signal into a square wave signal; and
sampling the square wave signal.

16. The method of claim 15, wherein the DC component is filtered out with a low-pass R-C filter of the first order.

17. The method of claim 15 further comprising generating the noise signal.

18. The method of claim 17, wherein the noise signal comprises a voltage signal.

19. The method of claim 18, wherein generating the noise signal comprises propagating a voltage signal through a first resistor coupled to a bias node of a biasing circuit and to a first input of a differential amplifier and a second resistor coupled to the bias node of the biasing circuit and to a first input of the differential amplifier.

20. The method of claim 15 wherein the sampling is at a predetermined clock rate.

21. The method of claim 15 wherein filtering out the DC component and amplifying the AC component comprise:
passing the noise signal through a low-pass filter; and
amplifying a difference between the noise signal and the low-pass-filtered noise signal.

22. A random sequence generator for generating a sequence of random bits, the generator comprising:
a filter having an input and an output and operable to receive a noise signal on the input and to pass a DC component of the noise signal to the output;
a differential amplifier having a first input operable to receive the noise signal and having a second input coupled to the output of the filter, the amplifier operable to reject the DC component of the noise signal and to amplify an AC component of the noise signal; and
a wave conversion circuit operable to convert the amplified AC component of the noise signal to the sequence of random bits.

23. A method, comprising:
low-pass filtering a noise signal;
amplifying a difference between the noise signal and the low-pass-filtered noise signal; and
converting the amplified difference into a random sequence of values.

24. The method of claim 23 wherein converting the amplified difference into a random sequence of values comprises:
converting the amplified difference into a square wave signal; and
sampling the square wave signal to generate the random sequence of values.

25. The method of claim 23 wherein the random sequence of values comprises a random sequence of binary values.

26. An electronic system, comprising:
a random sequence generator for generating a sequence of random bits, the generator comprising,
a filter having an input and an output and operable to receive a noise signal on the input and to pass a DC component of the noise signal to the output, a differential amplifier having a first input operable to receive the noise signal and having a second input coupled to the output of the filter, the amplifier operable to reject the DC component of the noise signal and to amplify an AC component of the noise signal, and a wave conversion circuit operable to convert the amplified AC component of the noise signal to a random sequence of bits.

* * * * *